US012270961B2

(12) United States Patent
Willen

(10) Patent No.: US 12,270,961 B2
(45) Date of Patent: Apr. 8, 2025

(54) FULL WAVEFIELD INVERSION OF OCEAN BOTTOM SEISMIC DATA

(71) Applicant: ExxonMobil Technology and Engineering Company, Spring, TX (US)

(72) Inventor: Dennis E. Willen, Conroe, TX (US)

(73) Assignee: ExxonMobil Technology and Engineering Company, Spring, TX (US)

( * ) Notice: Subject to any disclaimer, the term of this patent is extended or adjusted under 35 U.S.C. 154(b) by 536 days.

(21) Appl. No.: 16/204,368

(22) Filed: Nov. 29, 2018

(65) Prior Publication Data

US 2019/0196038 A1   Jun. 27, 2019

Related U.S. Application Data

(60) Provisional application No. 62/609,400, filed on Dec. 22, 2017.

(51) Int. Cl.
*G01V 1/28* (2006.01)
*G01V 20/00* (2024.01)
*G06F 30/20* (2020.01)
*G06T 11/00* (2006.01)

(52) U.S. Cl.
CPC .............. *G01V 1/28* (2013.01); *G01V 1/282* (2013.01); *G01V 20/00* (2024.01); *G06F 30/20* (2020.01); *G06T 11/006* (2013.01); *G01V 2210/1427* (2013.01); *G01V 2210/67* (2013.01)

(58) Field of Classification Search
CPC ........ G01V 1/28; G01V 1/282; G01V 99/005; G01V 2210/1427; G01V 2210/67; G01V 20/00; G06F 30/20; G06T 11/006
See application file for complete search history.

(56) References Cited

U.S. PATENT DOCUMENTS

| 8,121,823 B2 | 2/2012 | Krebs et al. | 703/10 |
| 8,538,699 B2 * | 9/2013 | Jing | G01V 3/12 |
| | | | 702/7 |
| 8,694,299 B2 | 4/2014 | Krebs et al. | 703/10 |

(Continued)

OTHER PUBLICATIONS

Moore, I., Dragoset, B., Ommundsen, T., Wilson, D., Eke, D., & Ward, C. (Jan. 1, 2008). Simultaneous Source Separation Using Dithered Sources. Society of Exploration Geophysicists.*

(Continued)

*Primary Examiner* — David A Hopkins
(74) *Attorney, Agent, or Firm* — ExxonMobil Technology and Engineering Company—Law Department

(57) ABSTRACT

A method of full wavefield inversion using simultaneous-source, ocean bottom sensor (OBS) data, including: obtaining, with a computer, simultaneous-source OBS data recorded by receivers in a seismic acquisition; generating, with a computer, synthetic OBS seismic data from a model based on reciprocity; blending, with a computer, the synthetic OBS seismic data; differencing, with a computer, the simultaneous-source OBS data recorded by receivers and the synthetic data to form a pseudo-deblended residual; updating the model based on the pseudo-deblended residual; and prospecting for hydrocarbons at a location derived from the updated model.

8 Claims, 13 Drawing Sheets

(56) References Cited

U.S. PATENT DOCUMENTS

| | | | | |
|---|---|---|---|---|
| 2007/0274155 | A1* | 11/2007 | Ikelle | G01V 1/36 367/38 |
| 2010/0008184 | A1* | 1/2010 | Hegna | G01V 1/3808 367/21 |
| 2010/0018718 | A1* | 1/2010 | Krebs | G06F 30/20 702/14 |
| 2011/0255371 | A1* | 10/2011 | Jing | G01V 1/28 367/73 |
| 2011/0264421 | A1* | 10/2011 | Jing | G01V 3/38 703/2 |
| 2012/0039149 | A1* | 2/2012 | van Borselen | G01V 1/362 367/24 |
| 2013/0238246 | A1* | 9/2013 | Krebs | G01V 9/00 702/14 |
| 2014/0198607 | A1* | 7/2014 | Etienne | G01V 1/3852 367/14 |
| 2017/0031041 | A1* | 2/2017 | Ratcliffe | G01V 99/005 |
| 2017/0168177 | A1* | 6/2017 | Wang | G01V 1/282 |
| 2019/0353814 | A1* | 11/2019 | Cha | G01V 1/362 |

OTHER PUBLICATIONS

Anagaw, "Full waveform inversion using simultaneous encoded sources based on first-and second-order optimization methods", 2014, PhD Dissertation, University of Alberta (Year: 2014).*

Operto, Stéphane, et al. "Efficient 3-D frequency-domain monoparameter full-waveform inversion of ocean-bottom cable data: application to Valhall in the visco-acoustic vertical transverse isotropic approximation." Geophysical Journal International 202.2 (2015): 1362-1391. (Year: 2015).*

Ben-Hadj-Ali, Hafedh, Stephane Operto, and Jean Virieux. "Velocity model building by 3D frequency-domain, full-waveform inversion of wide-aperture seismic data." Geophysics 73.5 (2008): VE101-VE117. (Year: 2008).*

Kumar, Rajiv, et al. "Efficient matrix completion for seismic data reconstruction." Geophysics 80.5 (2015): V97-V114. (Year: 2015).*

Schiemenz, Alan, and Heiner Igel. "Accelerated 3-D full-waveform inversion using simultaneously encoded sources in the time domain: Application to Valhall ocean-bottom cable data." Geophysical Journal International 195.3 (2013): 1970-1988. (Year: 2013).*

Shin, Changsoo, et al. "Efficient calculation of a partial-derivative wavefield using reciprocity for seismic imaging and inversion." Geophysics 66.6 (2001): 1856-1863. (Year: 2001).*

Wu, Zedong, and Tariq Alkhalifah. "Simultaneous inversion of the background velocity and the perturbation in full-waveform inversion." Geophysics 80.6 (2015): R317-R329. (Year: 2015).*

Huang et al., "Full Waveform Inversion with Multisource Frequency Selection of Marine Streamer Data", Los Alamos National Labs, LA-UR-17-22398, Published on Oct. 28, 2017 (Year: 2017).*

Anagaw, Amsalu Y., and Mauricio D. Sacchi. "Comparison of multifrequency selection strategies for simultaneous-source full-waveform inversion." Geophysics 79.5 (2014): R165-R181. (Year: 2014).*

Gauthier et al. (1986) "Two-Dimensional Nonlinear Inversion of Seismic Waveforms: Numerical Results," *Geophysics*, vol. 51, No. 7, pp. 1387-1403.

Liu, et al. (2012) "3-D Time-Domain Full Waveform Inversion of a Valhall OBC Dataset," abstracts of the 82nd Annual International Meeting, *Society of Exploration Geophysicists*, Las Vegas, 2012.

Paramo et al. (2013) "AVO Analysis of Independent Simultaneous Source OBC Data from Trinidad," abstracts of the 83rd Annual International Meeting, *Society of Exploration Geophysicists*, Houston, pp. 368-372.

Wang, et al. (2016) "Advanced Deblending Scheme for Independent Simultaneous Source Data," Abstracts of the 25th Annual Conference and Exhibition, *Australian Society of Exploration Geophysicists*, pp. 564-568.

Xu et al. (1995) "3-D Prestack Full-Wavefield Inversion," *Geophysics*, vol. 60, No. 6, pp. 1805-1818.

* cited by examiner

FULL WAVEFIELD INVERSION OF OCEAN BOTTOM SEISMIC DATA

CROSS REFERENCE TO RELATED APPLICATIONS

This application claims the priority benefit of U.S. Provisional Patent Application No. 62/609,400 filed Dec. 22, 2017 entitled FULL WAVEFIELD INVERSION OF OCEAN BOTTOM SEISMIC DATA, the entirety of which is incorporated by reference herein.

TECHNOLOGICAL FIELD

This disclosure relates generally to the field of geophysical prospecting and, more particularly, to seismic data processing. Specifically, the disclosure relates to a method full wavefield inversion of ocean bottom seismic data.

BACKGROUND

This section is intended to introduce various aspects of the art, which may be associated with exemplary embodiments of the present invention. This discussion is believed to assist in providing a framework to facilitate a better understanding of particular aspects of the present invention. Accordingly, it should be understood that this section should be read in this light, and not necessarily as admissions of prior art.

Seismic data are conventionally acquired with sources of acoustic energy that send sound waves into the earth. These sound waves reflect from the earth's rock strata, are measured and recorded at or near the surface, and the data incorporated into algorithms that construct images of the subsurface. In the offshore environment, the measurement is usually by sensors deployed along streamers that are towed behind a seismic vessel. Less commonly, measurement is by sensors deployed along the seafloor in the form of Ocean-bottom Cables (OBC), Ocean-bottom Nodes (OBN), or, generically, Ocean-bottom Sensors (OBS).

Simultaneous sourcing, also called blended sourcing, is a seismic acquisition method for reducing acquisition costs and improving spatial sampling. Conventionally, surveys are acquired by locating a single point source or an array of point sources at a single source location, firing the sources at the same time and then recording the response for the time needed for the sources to finish firing followed by a listening time in which all returns from the subsurface target are recorded. Optionally, the firing of the sources can be repeated and multiple records can be recorded at the same location. Then, the source array is moved to another location, and the process is repeated. The cost of acquiring seismic data by this sequential method is related to the time needed to record each individual source location and the number of such locations, and this cost often limits the ability to record data at fine sampling. By firing one or more point sources at different source locations at the same time or at nearly the same time within the same data record, acquisition time and cost can be reduced and sampling increased. This may be referred to as simultaneous acquisition. Originally, when the method was introduced, the interfering sources were excited at exactly the same time or simultaneously. Today, the same term is also used for acquisition in which sources fire within the same time window as another source even though the firing of the sources is not simultaneous in time and differs by some time delay. Generally, the sources that fire at nearly the same time within the same short record form an extended spatial or areal array, with no expectation that the positions of the individual point sources are close together. Also, the overlapping or interfering signals may come from sources on a single vessel, sources on different vessels, or a combination of both.

An important goal of seismic prospecting is to accurately image subsurface structures commonly referred to as reflectors. Seismic prospecting is facilitated by obtaining raw seismic data during performance of a seismic survey. During a seismic survey, seismic energy can be generated at ground or sea level by, for example, a controlled explosion (or other form of source, such as vibrators), and delivered to the earth. Seismic waves are reflected from underground structures and are received by a number of sensors/receivers, such as geophones. The seismic data received by the geophones is processed in an effort to create an accurate mapping of the underground environment. The processed data is then examined with a goal of identifying geological formations that may contain hydrocarbons (e.g., oil and/or natural gas).

Full Wavefield Inversion (FWI) is a seismic method capable of utilizing the full seismic record, including the seismic events that are treated as "noise" by standard inversion algorithms. The goal of FWI is to build a realistic subsurface model by minimizing the misfit between the recorded seismic data and synthetic (or modeled) data obtained via numerical simulation.

One important mathematical algorithm applied to seismic data is Full Wavefield Inversion, variously known as Full Waveform Inversion or FWI (Xu et al., "3-D Prestack Full-Wavefield Inversion," Geophysics, vol 60, no. 6, pp 1805-1818, 1995, the entirety of which is hereby incorporated by reference; Gauthier et al., "Two-Dimensional Nonlinear Inversion of Seismic Waveforms: Numerical Results," Geophysics, vol. 51, no. 7, pp. 1387-1403, 1986, the entirety of which is hereby incorporated by reference). FWI creates and solves an inversion problem to find, at a minimum, a model of the velocities (or other physical property, such as impedance) of geologic strata along with their locations. FWI accomplishes this by minimizing the difference between measured seismic data and synthetic data computed from an estimate of the subsurface velocities and knowledge of the source excitations. Data are typically synthesized using techniques such as finite differences or finite elements. The requirement that the measured and synthetic data match is typically expressed in terms of minimizing an objective function. The objective function will at least contain some measure of the difference between acquired and synthetic data and may include one or more additional terms to stabilize the computed earth model (typically velocity but any physical property used in FWI), which is normally called model regularization terms to ensure the smoothness of the model or to preserve boundaries of the model as a part of the objective function, or to ensure consistency with other, non-seismic, data. Requiring that the objective function decrease results in mathematical formulae for the model gradient, which is the mathematical direction in which the model should be updated.

Typically, trial step sizes are taken in this direction and their impact on the objective function compared before deciding upon an actual model update consisting of both a gradient direction and a step size. After updating the model, the process may be iterated, further adjusting the model and decreasing the data difference between measured and synthetic data. The iterations are stopped when the difference is sufficiently small or the model sufficiently accurate. Various physical parameters can be included in the earth model, such as density, compressional velocity, shear velocity, anisotropy, and attenuation.

FWI is a computationally-intensive application and many techniques have been developed to reduce the time and costs associated with it. In particular, FWI is usually applied to OBS data in the form of common-receiver gathers and by invoking reciprocity (Liu, et al., "3-D Time-Domain Full Waveform Inversion of a Valhall OBC Dataset," abstracts of the 82nd Annual International Meeting, Society of Exploration Geophysicists, Las Vegas, 2012). A common-receiver gather is seismic data recorded in a particular sensor from all of the source excitations. This is in contrast to a common-shot gather, which is the data from a particular source excitation as recorded in all sensors. In typical OBS applications, there are far fewer Ocean-bottom Sensors (hundreds to a few thousand) than source excitations (tens of thousands to one million or more). As a result, there are far fewer common-receiver gathers than common-shot gathers in an OBS dataset.

Reciprocity is a property of the underlying equations governing propagation of acoustic and elastic waves in the earth. Reciprocity implies that OBS data may be treated as if a source had been located on the seafloor and the data recorded by sensors at the location of the physical sources, near the surface. For conventional acquisition, where there is no concern that reflections from different source excitations may overlap in time, the common-receiver data can be assembled as if the seafloor "source" was excited only once to generate signals at all of the surface "sensors". That is, the data synthesis and back-propagation steps in FWI can usually be carried out on common-receiver OBS data using reciprocity, resulting in considerable savings of computational time and resources.

FWI can be directly carried out on simultaneous-source common-shot gathers. Such data can always be partitioned into moderate time intervals, say 5-15 seconds but rarely more than 30 seconds, corresponding to a small number of source excitations, say 2-4 but rarely more than 8. As long as the timing and locations of the different source excitations are understood, the synthesis step for simultaneous-source shot gathers can readily be carried out by standard methods. Likewise, the mathematical analysis for updating the model is unchanged from that for conventional data.

Unfortunately, the same is not true when applying FWI to simultaneous-source common-receiver gathers. Common-receiver data will have been acquired over the course of many hours (for streamer data) or many weeks (for OBS data). Time intervals such as these are far too long to efficiently carry out the synthesis and back-propagation steps in FWI to invert the simultaneous-source data as it was acquired. Reciprocity is a statement about a sensor at one location and a source at one location and it cannot be directly applied to the overlapped data acquired during simultaneous-source acquisition. For simultaneous-source data, where the overlap among signals from different sources cannot be ignored, it is not possible to assemble a common-receiver gather as if the seafloor "source" was excited only once to generate signals at all of the surfaces sensors". Without some additional inventive step, the savings in time and computational resources afforded by reciprocity are lost for simultaneous-source OBS data.

The implied solution, typified in Paramo et al., "AVO Analysis of Independent Simultaneous Source OBC Data from Trinidad," abstracts of the 83rd Annual International Meeting, Society of Exploration Geophysicists, Houston, 2013, pp. 368-372 the entirety of which is hereby incorporated by reference, is to deblend the simultaneous-source OBS data. Deblending is described in Wang, et al., "Advanced Deblending Scheme for Independent Simultaneous Source Data," Abstracts of the 25th Annual Conference and Exhibition, Australian Society of Exploration Geophysicists, 2016, the entirety of which is hereby incorporated by reference, and references therein. Deblending applies techniques to reconstruct the seismic data that would have been acquired if the excitations had been separated by enough time to avoid any overlap—in other words, to avoid any interference among the excitations. In this vein, simultaneous source data is sometimes referred to as "blended" data. Deblending operates by filtering away the interference in some domain where it appears random and then, optionally, solving an inversion problem that requires the separate, deblended outputs to sum correctly to match the input, blended dataset when the source excitation times are taken into account. When successful, the resulting deblended data can be used in FWI, as common-shot gathers for streamer data or common-receiver gathers for OBS data. However, deblending suffers from inaccuracies and potential data inadequacies inherent in the filtering methods (such as FK, Radon, or curvelet filters), where geologically-important signals might be mis-characterized as noise. Deblending also results in the significant computational expense, complexity, and approximations of solving a large number of inversion-based problems with the twin objectives of ensuring that the output data have the lowest levels of interference and successfully reconstruct the input simultaneous-source data.

A related concept is that of "pseudo-deblending", which assembles recorded seismic traces according to the excitation time of each source. Setting the requirements of reciprocity aside, it is possible to assemble a simultaneous-source, common-receiver gather by selecting any subset of all source excitations, ignoring the effects of interference. The result does no damage to the data and allows the geophysicist to examine both the coherent signals from the selected subset and the (usually) incoherent signals from interfering source excitations. However, unlike a fully deblended gather, it cannot be synthesized directly with reciprocity and therefore cannot be used within FWI unless further inventive steps are taken.

In actual applications of simultaneous-source acquisition, practitioners typically introduce some amount of randomization among the source locations and/or their excitation times. The primary purpose is to cause the interference among overlapping signals to become incoherent and thereby more easily mitigated with deblending or other signal processing techniques. A side effect is to reduce the amount of noise or "crosstalk" present in the model gradient and thereby improve the quality of the updated model. This type of randomization will not be confused with the selection of randomized subsets of data while computing the model gradient and forming a model update (Krebs et al, U.S. Pat. No. 8,694,299, the entirety of which is hereby incorporated by reference). The selection of randomized data subsets is an effort to improve the efficiency of FWI by reducing the burden of computing synthetics and a model update during each iteration while ensuring that the final earth model adequately explains all of the data.

It is useful to clarify some confusion over the use of the term "simultaneous-source" in the geophysics literature. The seismic acquisition and deblending literature typically use simultaneous-sourcing in the same sense as above: field measurements containing seismic data from two or more sources. The fact that seismic energy may propagate over great distances and long periods of time will cause no confusion to one skilled in the arts of seismic acquisition and processing. Simultaneous-sourcing occurs when useful signals from different source excitations arrive in the receiving apparatus at the same time. This would typically occur when the sources are within 10 km of each other and excited within 6 seconds of each other although useful information has been recovered from sources separated by as much as 50 km and excited within 30 seconds of each other.

The FWI literature, on the other hand, usually employs "simultaneous-source" to describe data that have been artificially summed or blended after being recorded by conventional means. In the present context, where the application of reciprocity is particularly useful, this approach corresponds to summing many common-receiver gathers (as many as 50 or more) then synthesizing them at the same time, resulting in considerable time and computational savings (Krebs et al, U.S. Pat. No. 8,121,823, the entirety of which is hereby incorporated by reference).

In contrast to the FWI encoding technique, simultaneous sourcing herein refers to field acquisition of overlapping data from more than one source excitation. In addition to small, random time shifts on the order of 0-2 seconds, the source excitations can be separated by several seconds.

SUMMARY

A method of full wavefield inversion using simultaneous-source, ocean bottom sensor (OBS) data, including: obtaining, with a computer, simultaneous-source OBS data recorded by receivers in a seismic acquisition; generating, with a computer, synthetic OBS seismic data from a model based on reciprocity; blending, with a computer, the synthetic OBS seismic data; differencing, with a computer, the simultaneous-source OBS data recorded by receivers and the synthetic data to form a pseudo-deblended residual; updating the model based on the pseudo-deblended residual; and prospecting for hydrocarbons at a location derived from the updated model.

In the method, the blending of the synthetic OBS seismic data can be based on field acquisition parameters.

In the method, the generating synthetic OBS seismic data using reciprocity can include synthesizing source excitation locations in the simultaneous-source OBS data recorded by receivers in the seismic acquisition.

In the method, the model can be an earth model.

The method can further include imaging subsurface structures from the updated model.

A method of full wavefield inversion using simultaneous-source, ocean bottom sensor (OBS) data, including: obtaining, with a computer, simultaneous-source OBS data recorded by receivers in a seismic acquisition; obtaining, with a computer at least one of conventional streamer seismic data, conventional OBS seismic data, and simultaneous-source streamer seismic data; generating, with a computer, synthetic OBS seismic data from a model based on reciprocity; blending, with a computer, the synthetic OBS seismic data corresponding to the obtained simultaneous source OBS seismic data; differencing, with a computer, the simultaneous-source OBS data recorded by receivers and the synthetic OBS seismic data to form a pseudo-deblended residual; differencing, with a computer, the conventional OBS seismic data or streamer seismic data and corresponding synthetic seismic data to obtain a conventional OBS residual or a streamer residual; updating, with a computer, the model based on one or more of the pseudo-deblended residual, the conventional OBS residual, or the streamer residual; and prospecting for hydrocarbons at a location derived from the updated model.

In the method, the blending of the synthetic OBS seismic data can be based on field acquisition parameters.

In the method, the generating synthetic OBS seismic data using reciprocity can include synthesizing source excitation locations in the simultaneous-source OBS data recorded by receivers in the seismic acquisition.

In the method, the model can be an earth model.

The method can further include imaging subsurface structures from the updated model.

BRIEF DESCRIPTION OF THE DRAWINGS

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims. It should also be understood that the drawings are not necessarily to scale, emphasis instead being placed upon clearly illustrating principles of exemplary embodiments of the present invention. Moreover, certain dimensions may be exaggerated to help visually convey such principles.

DETAILED DESCRIPTION OF EXAMPLE EMBODIMENTS

Exemplary embodiments are described herein. However, to the extent that the following description is specific to a particular embodiment, this is intended to be for exemplary purposes only and simply provides a description of the exemplary embodiments. Accordingly, the invention is not limited to the specific embodiments described below, but rather, it includes all alternatives, modifications, and equivalents falling within the true spirit and scope of the appended claims.

The present technological advancement can solve the technical problem of applying FWI to simultaneous-source OBS data by synthesizing conventional OBS data using reciprocity and blending it so that it may be directly compared to acquired simultaneous-source OBS data. Central to this technological improvement is an understanding of how OBS seismic data can be efficiently synthesized by invoking reciprocity and then blended to match simultaneous-source data as it was acquired in the field.

The present technological advancement aims to improve the technological fields of geophysical processing and hydrocarbon prospecting (including exploration, development, and production) by providing a method that applies FWI to simultaneous-source OBS data while retaining the computational advantages of reciprocity. The present technological advancement improves how the computer implements FWI by enabling the computer to work with blended data, which improves computer efficiency.

FWI is a computer-implemented geophysical method that is used to invert for subsurface properties, such as velocity or acoustic impedance. The crux of any FWI algorithm can be described as follows: using a starting subsurface physical property model, synthetic seismic data are generated, i.e. modeled or simulated, by solving the wave equation using a numerical scheme (e.g., finite-difference, finite-element etc.). The term velocity model or physical property model as used herein refers to an array of numbers, typically a 3-D array, where each number, which may be called a model parameter, is a value of velocity or another physical property in a cell, where a subsurface region has been conceptually divided into discrete cells for computational purposes. The synthetic seismic data are compared with the field seismic data and using the difference between the two, an error or objective function is calculated. Using the objective function, a modified subsurface model is generated which is used to simulate a new set of synthetic seismic data. This new set of synthetic seismic data is compared with the field data to generate a new objective function. A global or local optimization method is used to minimize the objective function and to update the subsurface model.

Figure 1:
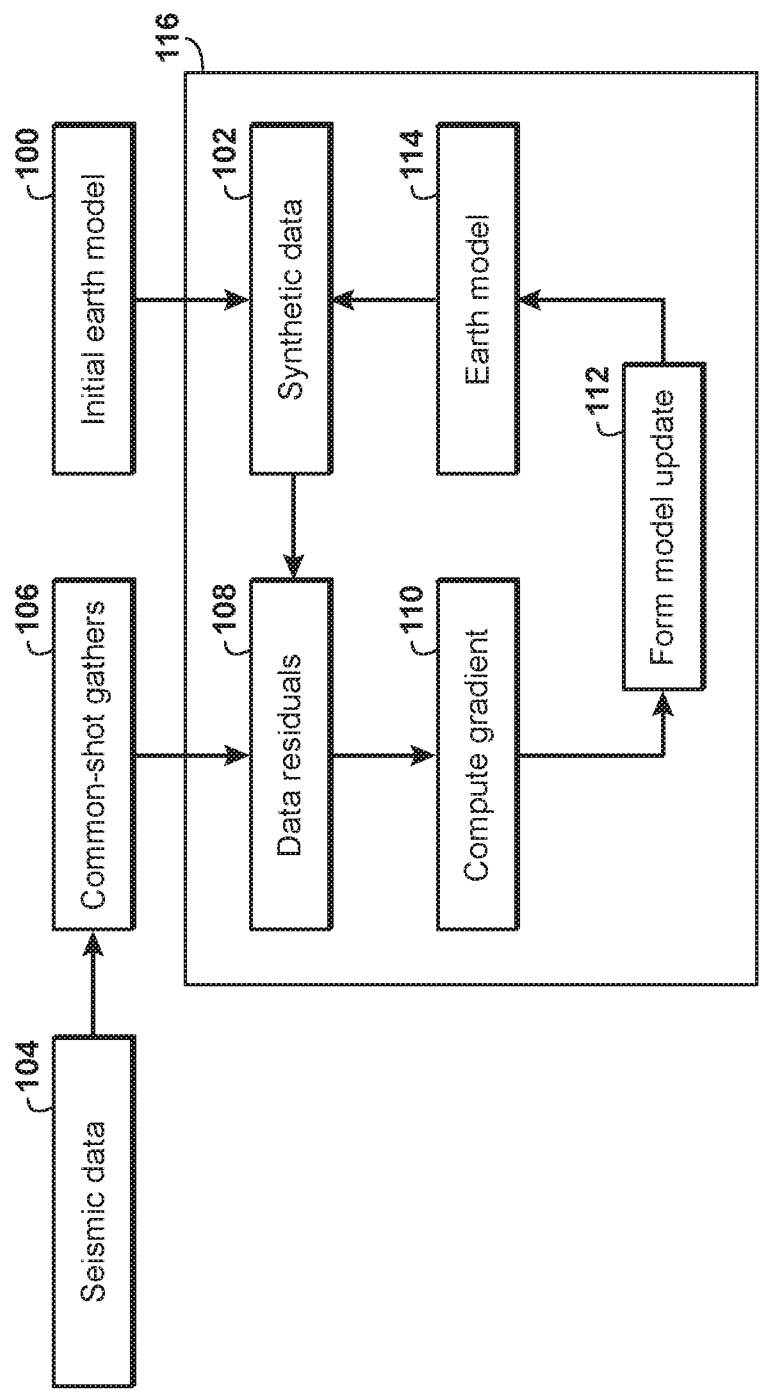
FIG. 1 illustrates an example of full wavefield inversion.

Referring to the description of Full Wavefield Inversion shown in FIG. 1, an initial earth model 100, is used to generate synthetic seismic data 102, by means of well-known techniques such as finite differences or finite elements. Earth model 100, may have been developed by a variety of techniques including semblance or focusing analysis of seismic data, well ties, FWI applied to different seismic data, or correlations with models developed from other, non-seismic datasets. Measured seismic data 104, is sorted to common-shot gathers 106, and synthetic data 102, are subtracted from the common-shot gathers to produce data residual 108. Common-shot gathers are preferred because they are efficiently synthesized. Minimizing an objective function which includes a data mismatch term results in a computed model gradient 110. Trial step sizes or more general line search techniques determine a preferred direction along the model gradient. Taken together, the gradient and update direction form a model update 112, which leads to an updated earth model 114. Generating synthetic data 102, from the updated earth model 114, begins the next iteration cycle in FWI process 116.

Figure 2:
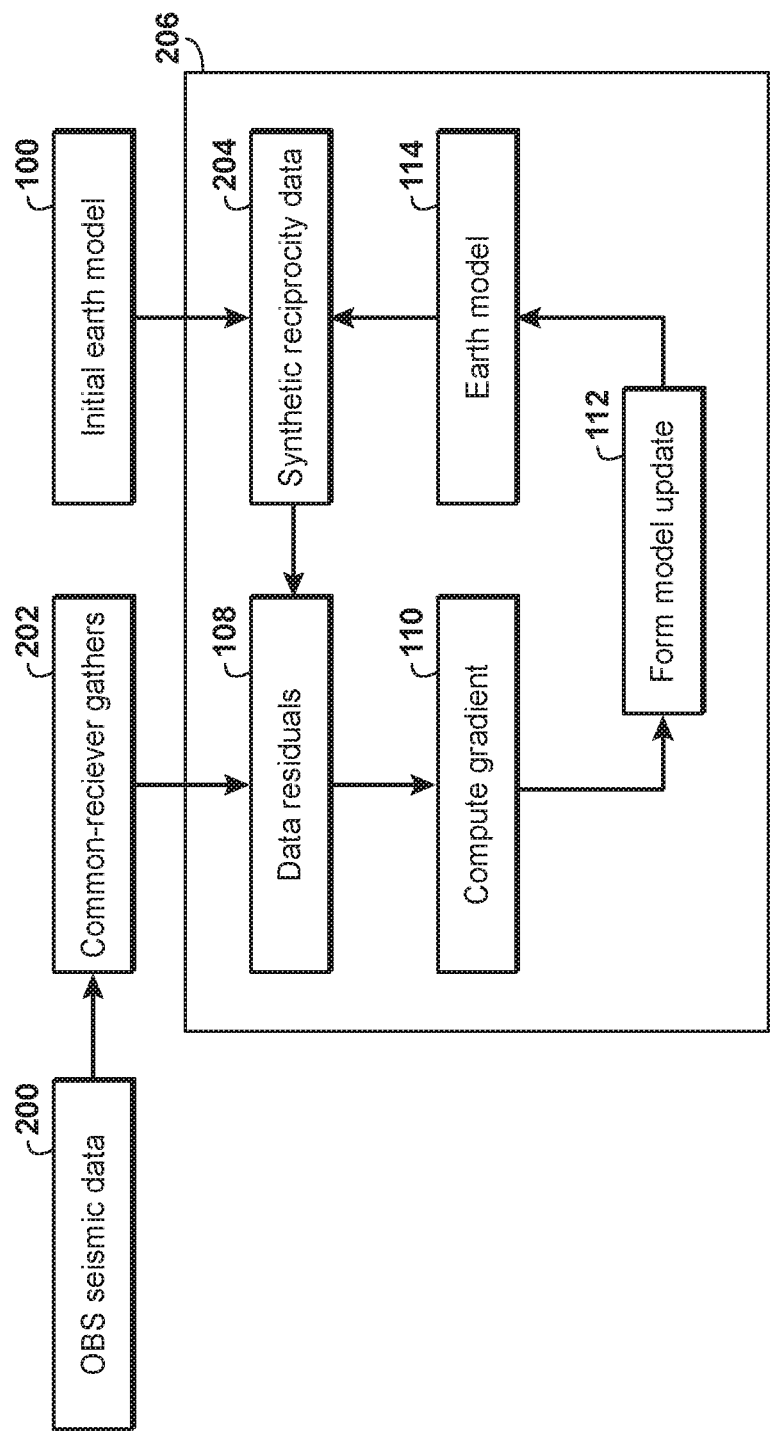
FIG. 2 illustrates an example of full wavefield inversion applied to OBS data.

FIG. 2 illustrates modifications of the FWI process to accommodate conventional OBS seismic data. In this scenario, initial earth model 100, is used to generate synthetic common-receiver data by application of reciprocity, which permits the interchange of source and receiver locations for purposes of computation. As discussed above, this permits a significant reduction in computational workload because of the numbers of source excitation locations are typically much larger than the number of seafloor OBS receiver locations. While it is entirely possible to synthesize common-shot gathers and then sort data to produce common-receiver, synthetic reciprocity data 204, direct synthesis of common-receiver gathers is far less costly. OBS seismic data 200, are sorted to common-receiver gathers 202, and synthetic data 204, are subtracted to form data residual 108. Minimizing an objective function containing the data misfit, results in the computation of a model gradient 110, and the determination of a model update 112, and an updated earth model. The process is iterated by FWI iteration loop 206, to further reduce the misfit and improve the accuracy of the earth model.

Figure 3:
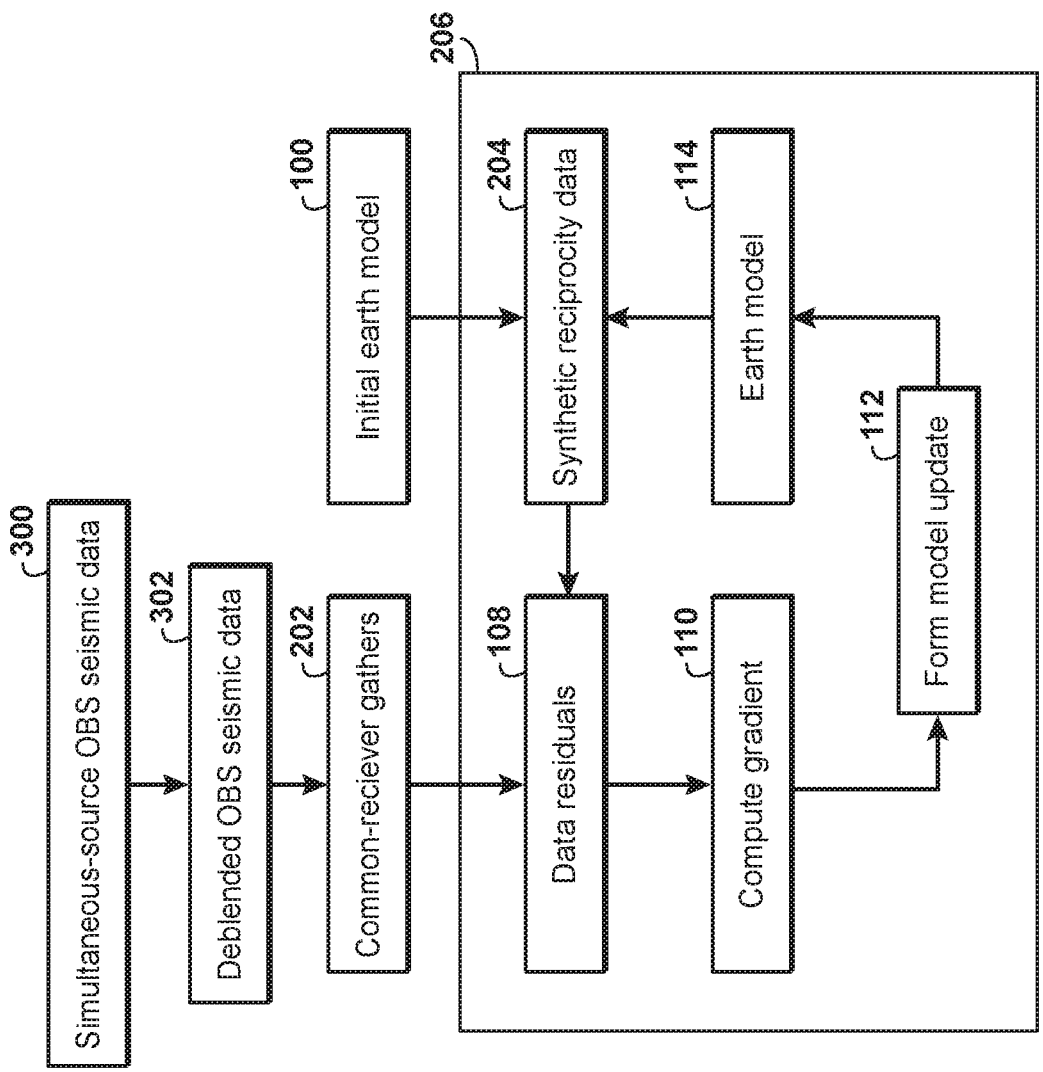
FIG. 3 illustrates an example of full wavefield inversion using deblending.

FIG. 3 describes the use of deblending to accommodate simultaneous-source OBS data in the FWI process. Simultaneous-source data 300, are deblended to produce deblended data 302, and then sorted to common-receiver gathers 202. By invoking reciprocity to switch source and receiver to generate OBS common receiver gathers, initial earth model 100, can be used to direct synthesize common-receiver gathers as synthetic data 204, and these can be subtracted from common-receiver gathers 202, to form data residual 108. The remaining steps of computing a model gradient 110, forming a model update 112, updating the earth model 114, and iterating FWI loop 206, proceed in the same way as the conventional OBS flow shown in FIG. 2.

Figure 4:
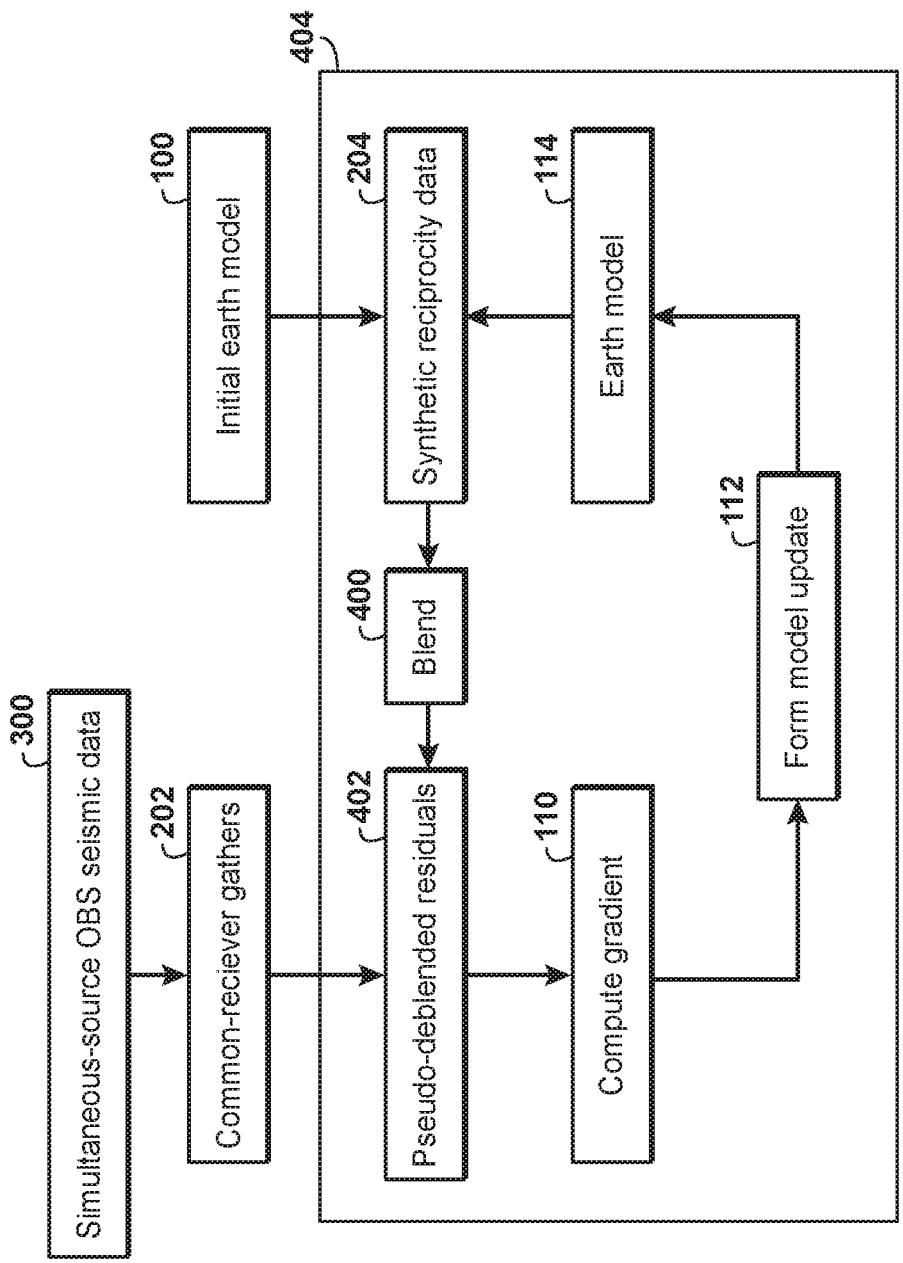
FIG. 4 illustrates an example of full wavefield inversion applied to OBS data without deblending.

An example of the present technological advancement, described in FIG. 4, avoids the time- and resource-consuming and potentially inaccurate deblending step 302. Here, simultaneous-source OBS data containing signal from multiple sources 300, are sorted to common-receiver gathers 202, without regard to the requirements of reciprocity that applies to only one source and receiver pair. As before, synthetic data 204, are efficiently generated from initial earth model 100, by invoking reciprocity. However, synthetic data 204, are now blended 400, to properly estimate the interference present in common-receiver gathers 202. In this form, synthetic data can be subtracted from acquired data to produce pseudo-deblended residual 402. Those skilled in the art of FWI will understand that there can be additional considerations to take into account for interferences in a common-receiver gathers involved in synthesis step 204. In particular, sufficient data should be synthesized to match not only the coherent signals in common-receiver gathers 202, but, after blending, to also match the interference present in gathers 202. Most often, an obvious subset of source locations which account for the coherent signals in gathers 202, will also suffice to reproduce the interference after blending step 400. However, there may be instances where gathers 202, have been preprocessed (for example, by muting long offsets) so that additional source locations should be synthesized in order to properly reproduce the interference. The remaining steps of computing a model gradient 110, forming a model update 112, updating the earth model 114, and iterating the new FWI loop 404, proceed in the same way as the conventional OBS flow shown in FIG. 2.

Figure 5:
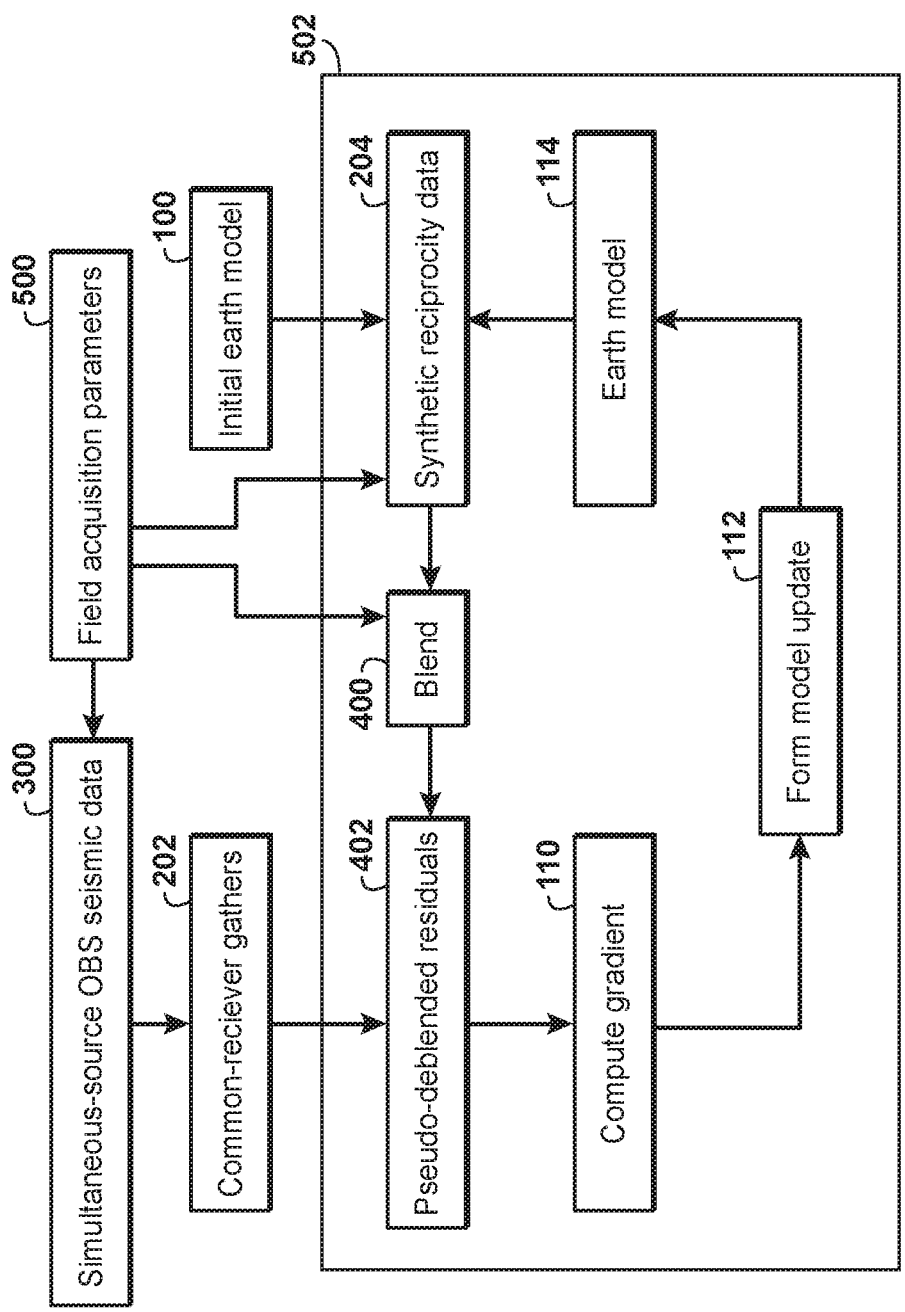
FIG. 5 illustrates an example of full wavefield inversion applied to OBS data without deblending and utilizing field acquisition parameters.

In a preferred embodiment of the present technological advancement, shown in FIG. 5, there is recognition that field acquisition parameters 500, have a role in supporting the present technological advancement. Field acquisition parameters 500, can include the times and locations of source excitations along with locations of sensors and the time intervals for which they recorded data. There is a considerable amount of techniques within industry regarding the placement and timing of source excitations and sensors, both to ensure sufficient illumination of the subsurface and to assist with the accurate and efficient deblending of simultaneous-source data. Many of these parameters are planned prior to the seismic survey in the form of shot schedules and pre-plots. Actual values will differ somewhat because of the vagaries of weather, ocean currents, marine mammals, battery life, and ship traffic. While pre-planned values will guide the operation of simultaneous-source data acquisition 300, actual values will be recorded and incorporated into synthesis step 204 to ensure synthetic data have the same source excitation times and locations as actual recorded values, and are blended on computer in the same way as happened in the field at the blending step 400. As can be seen from FIG. 5, iterating the FWI loop 502 otherwise carries on similarly to iterating the FWI loop 404 as described in FIG. 4.

Figure 6:
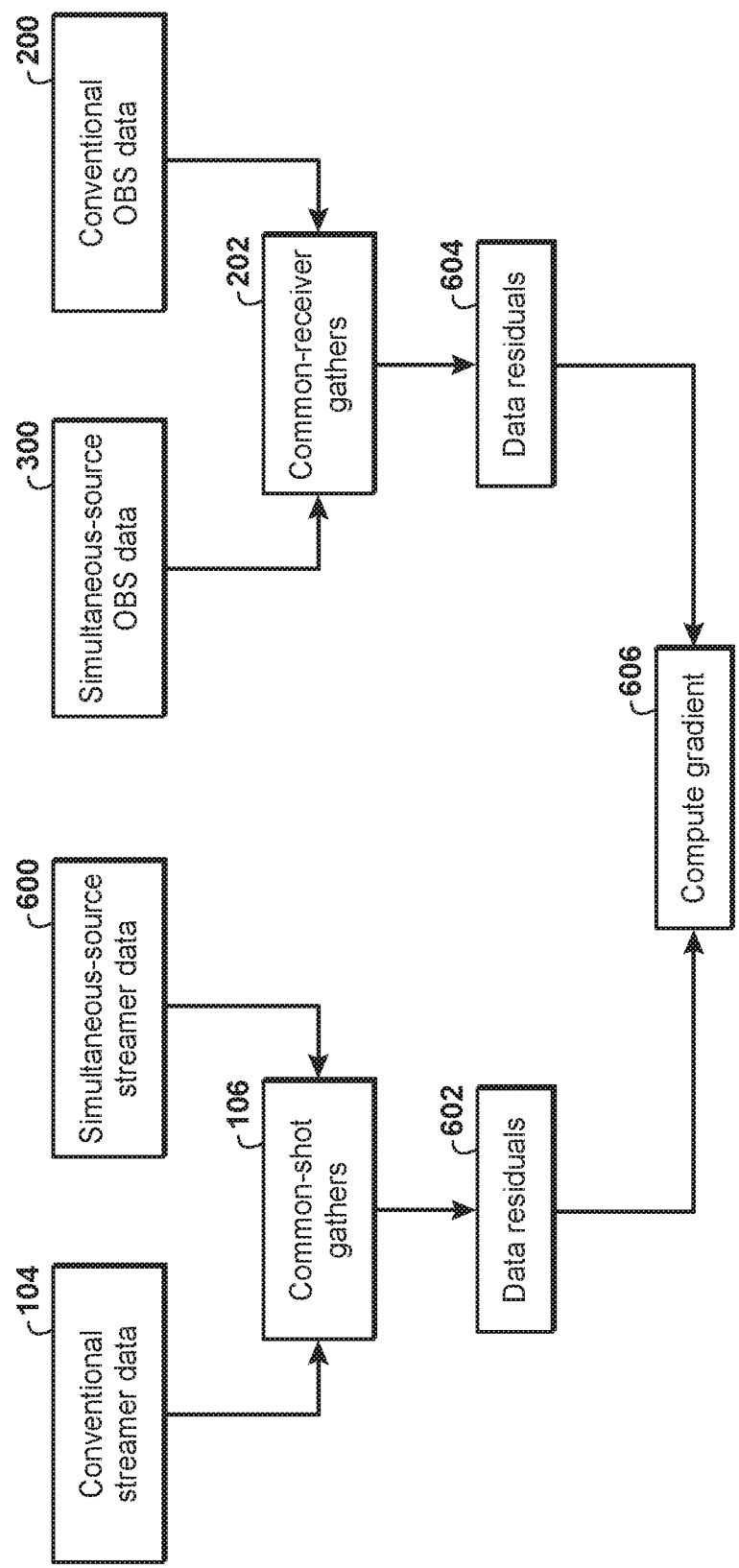
FIG. 6 illustrates an example of full wavefield inversion applied to a combined streamer and OBS data set.

Taken together with existing art, the present technological advancement provides a complete method for efficiently applying FWI to datasets including any combination of conventional (i.e., non-simultaneous source) and simultaneous sources together with streamer and OBS sensors. This is illustrated in FIG. 6, where conventional streamer data 104, and simultaneous-source streamer data 600, are assembled into common-shot gathers 106, which can be readily synthesized (not shown). Likewise, simultaneous-source OBS data 300, and conventional OBS data 200, can be assembled into common-receiver gathers 202, which can be readily synthesized by the methods described above. In this form, data residuals for streamer 602, and data residuals for OBS 604, can be computed separately and a combined model gradient by data residuals of streamer and OBS 606, determined as part of an FWI iteration loop. In particular, it offers the efficient acquisition and inversion of long-offset, wide-azimuth, and high-resolution seismic data without sacrificing accuracy and enduring time delays associated with deblending.

Figure 7:
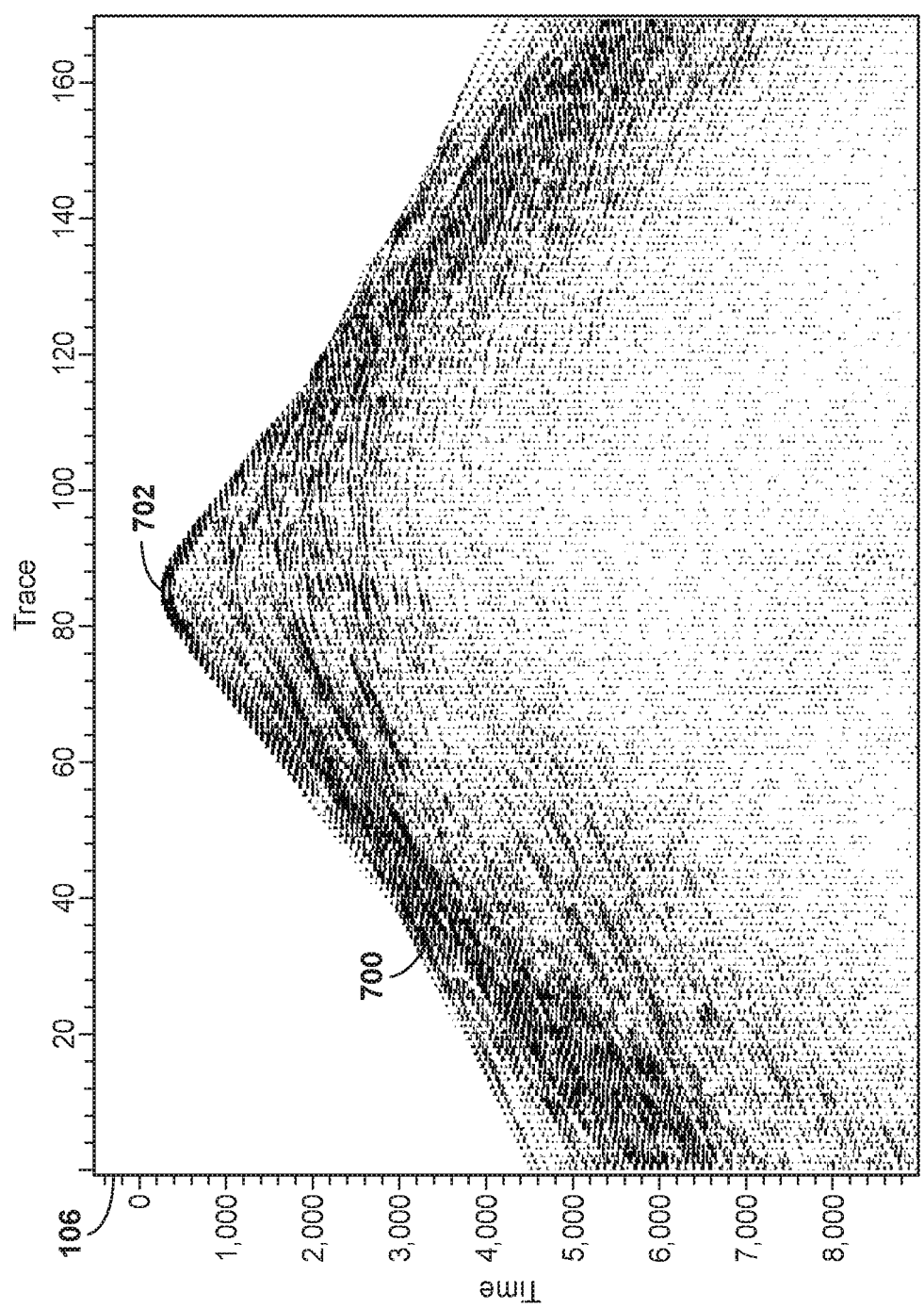
FIG. 7 illustrates an example of a common-shot gather of conventional OBS data.

To further illustrate the concepts herein, FIG. 7 shows a common-shot gather 106, of conventional OBS data. Coherent signals 700, are apparent as functions of time (vertical axis) and sensor location (horizontal axis). It is apparent that signals from the source were recorded by the closest sensor at location 702 and by more distant sensors at the left and right extremities.

Figure 8:
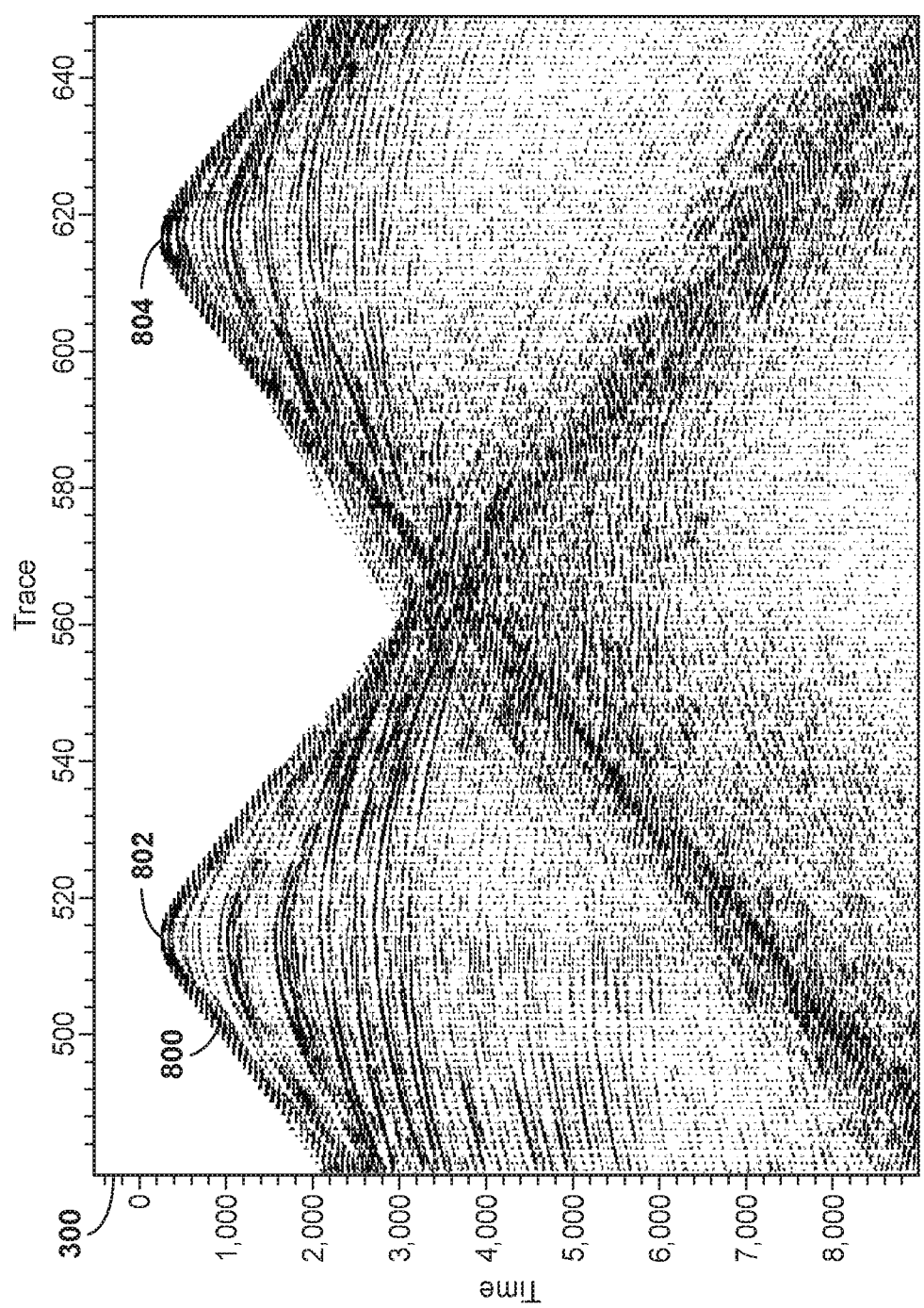
FIG. 8 illustrates an example of a common-shot gather of simultaneous-source OBS data.

As shown in FIG. 8, a common-shot gather of simultaneous-source OBS data 300, is somewhat more complex. Coherent signals 800, are again apparent as functions of time and sensor location. Having selected sensor locations along the horizontal axis to fully represent a source excitation near a sensor at 802, we are forced to observe signals from an interfering source located near a sensor at 804.

Figure 9:
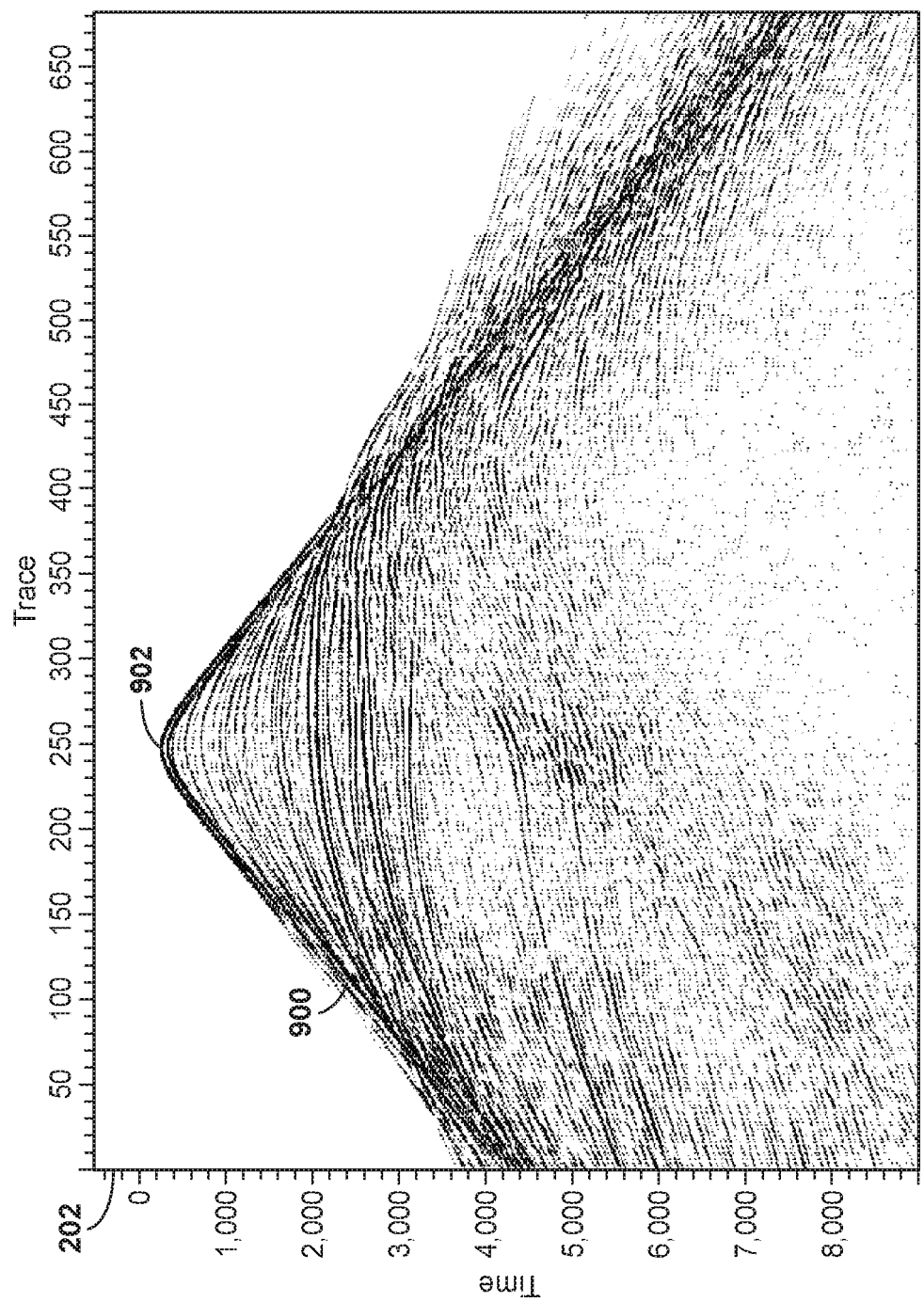
FIG. 9 illustrates an example of a common-receiver OBS gather constructed by reciprocity.

FIG. 9 shows a conventional, common-receiver OBS gather 202, constructed by invoking reciprocity. At first glance, these data are not significantly distinct from the common-shot gather shown in FIG. 7. However, coherent signals 900, are now associated with different source locations along the horizontal axis. At approximate location 902, there existed a source that was physically closest to this sensor. A careful look will furthermore show that the gather in FIG. 9 includes more data than the gather in FIG. 7, reflecting the fact that this survey involved fewer sensors than source locations.

Figure 10:
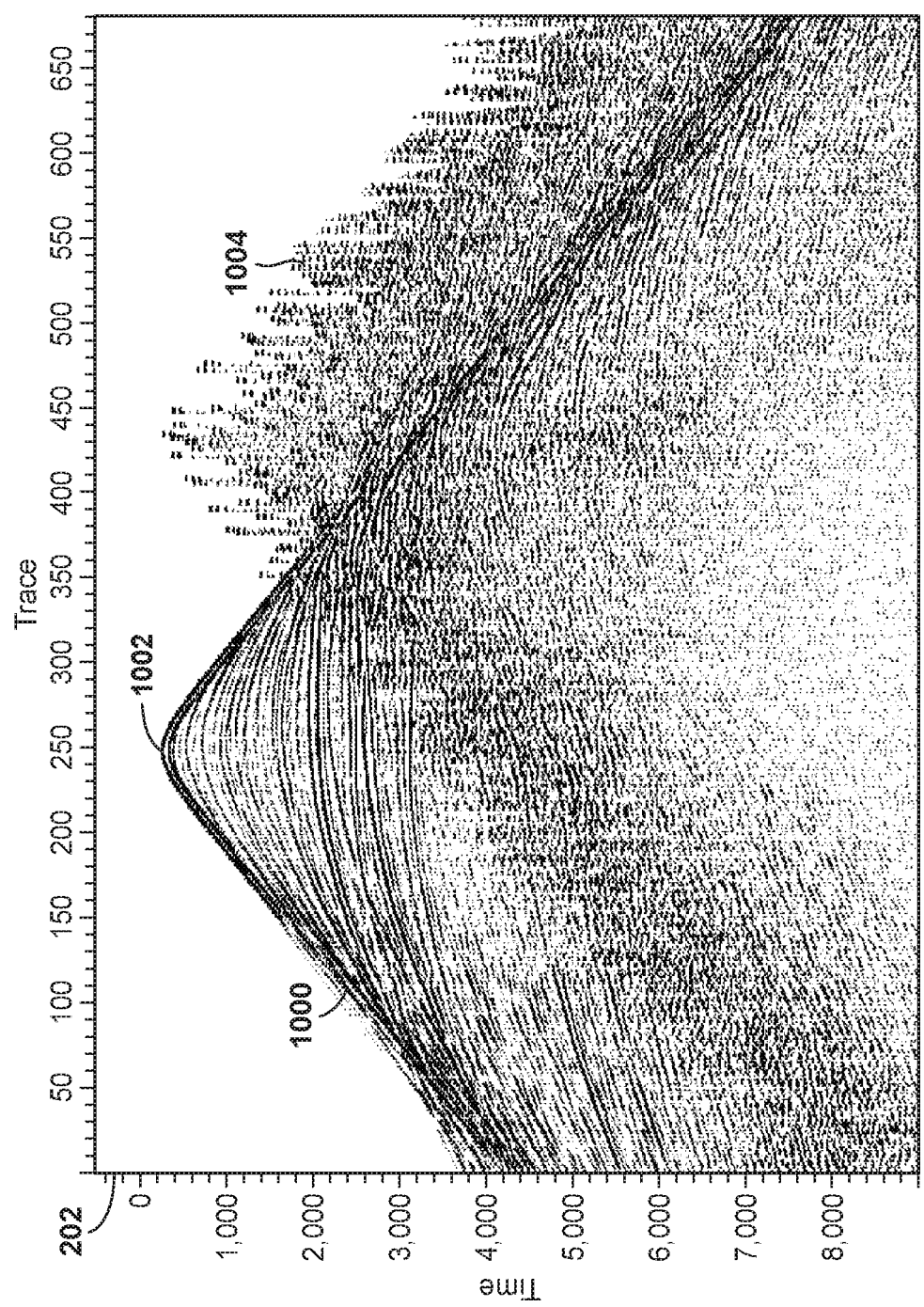
FIG. 10 illustrates a common-receiver, simultaneous-source OBS gather after pseudo-deblending.

The simultaneous-source, common-receiver OBS gather 202, shown in FIG. 10 is noticeably different. Coherent signals 1000, are apparent as functions of time and source location and location 1002 corresponds to a source location closest to this sensor. Having chosen source locations to fully represent these coherent data from the same source, the interference 1004, associated with an additional, simultaneous source is now apparent. This interference is not coherent because it comes from a source that was excited at random times relative to the source that generated coherent signal 1000. Despite the random appearance of interference 1004, it is not noise but is valid signal from a secondary source. Simultaneous-source gather 202, is said to be pseudo-deblended because it is intended to make a particular set of signals from the same source coherent with the side effect of randomizing other source signals and without any effort to fully deblend or separate signals from the two sources.

Figure 11:
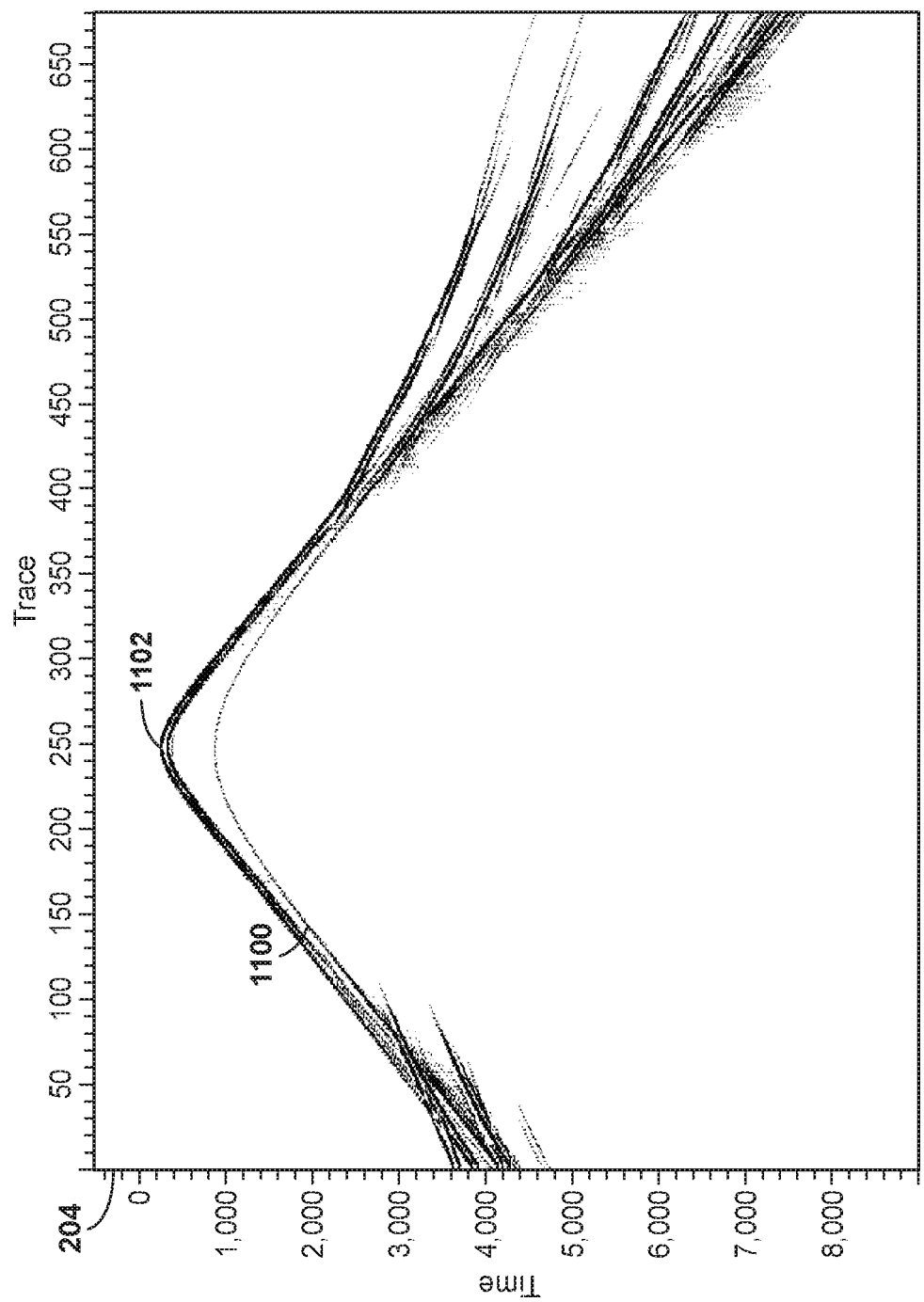
FIG. 11 illustrates a common-receiver OBS gather synthesized using reciprocity.

Reciprocity offers an efficient way to synthesize common-receiver gathers such as that shown in FIG. 11. Here, common-receiver OBS gather 204, contains coherent signal 1100. Of all the source excitation locations displayed along the horizontal axis, the location at about 1102 is nearest the sensor. This gather was synthesized from a very simple earth model therefore matches only a small part of gather 202 shown in FIG. 9. If the FWI loop were iterated, the earth model would become more complex and better match the real earth in the region of this survey, while gather 204 would better match gather 202.

Figure 12:
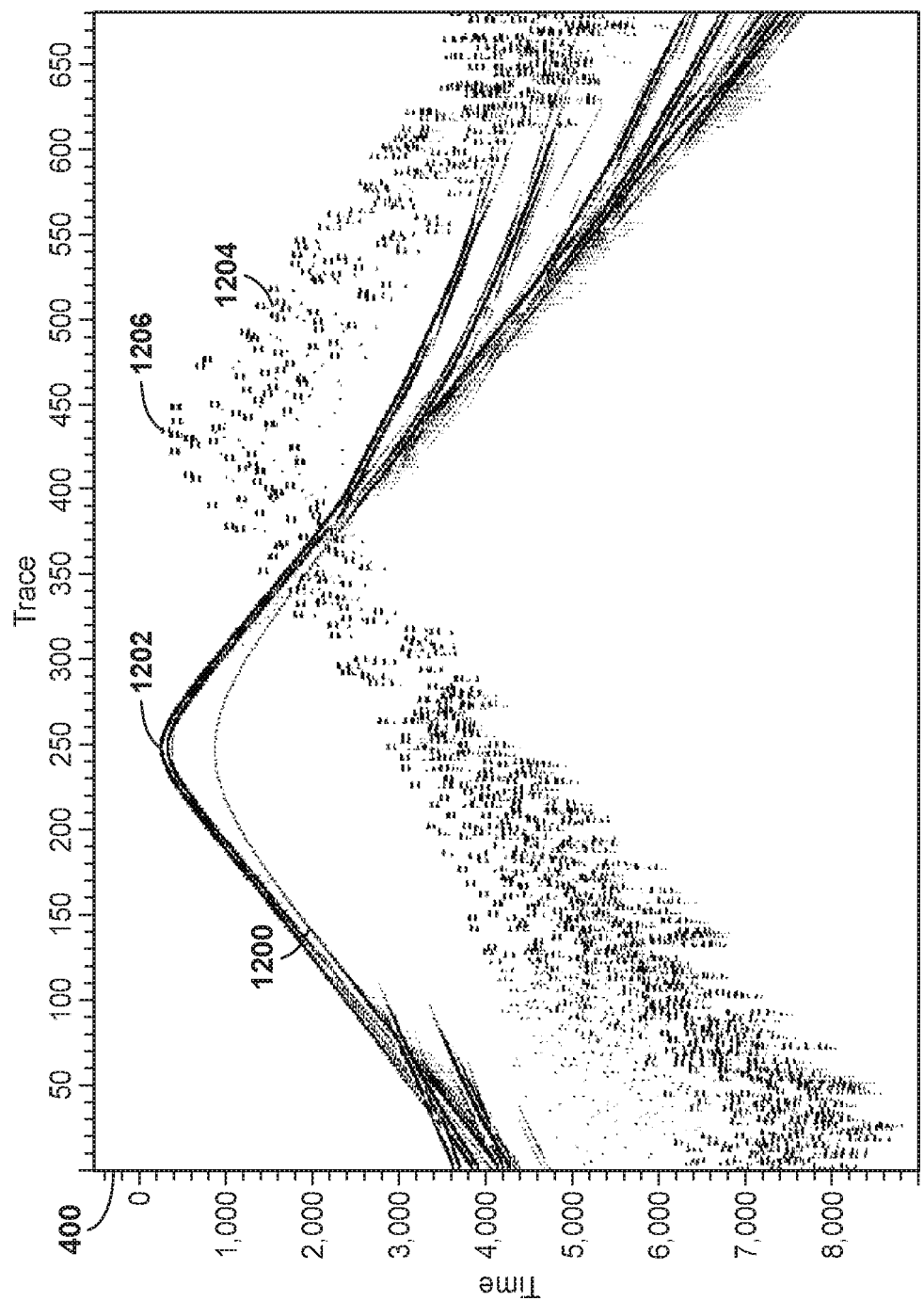
FIG. 12 illustrates a common-receiver, simultaneous-source OBS gather blended from synthetic data.

In addition to the computational efficiency already afforded by reciprocity, the practitioner is free to select additional source locations to be synthesized with little or no extra computational effort. As a result, it is straightforward, based on the field acquisition parameters, to synthesize enough data to construct the simultaneous-source receiver gather 400, shown in FIG. 12. Coherent signal 1200 is apparent along with approximate location 1202, of a source nearest to the sensor. Interference 1204, from an additional source is random relative to the first source, based on actual excitation times measured in the field. Since the horizontal axis has been calibrated to display the location of the first source, the second source appears to be closest to the sensor at location 1206, where the first source is some distance away.

It will be appreciated by those skilled in the art that the ability to apply FWI directly to simultaneous source data, forming blended synthetics and residuals from multiple sources in a single computational step rather than computing them in multiple steps, represents a valuable efficiency gain. Synthesizing simultaneous-source gathers, such as 400, which contain data from two or more sources translate directly to decreased FWI run times by factors of two or more.

Figure 13:
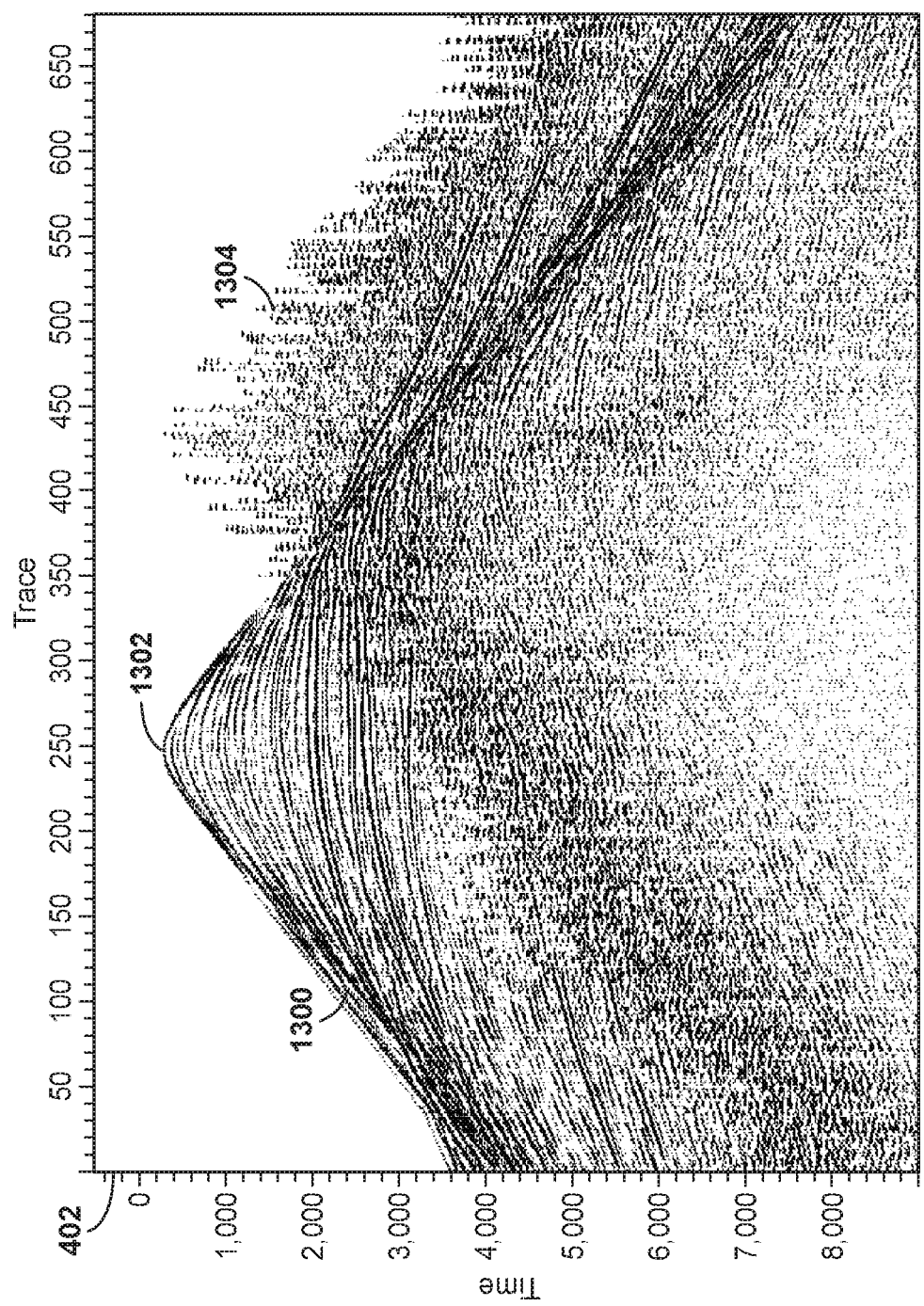
FIG. 13 illustrates an example of an OBS data residual.

To complete the illustration of the method, synthetic gather 400 has been subtracted from pseudo-deblended gather 202 shown in FIG. 10 to generate the pseudo-deblended residual 402, shown in FIG. 13. Careful study of coherent signal 1300, interference 1304, and closest source location 1302, will reveal that the amplitudes in FIG. 13 are decreased relative to those in FIG. 10, indicating that the earth model has some features that are generally correct and which can be further improved by computing a gradient and forming a model update. We can reasonably expect that this residual will further decrease as the FWI loop is iterated and the data are fit by the synthetics.

Furthermore, the present technological advancement can be used to manage hydrocarbons. As used herein, hydrocarbon management includes hydrocarbon extraction, hydrocarbon production, hydrocarbon exploration, identifying potential hydrocarbon resources, identifying well locations, determining well injection and/or extraction rates, identifying reservoir connectivity, acquiring, disposing of and/or abandoning hydrocarbon resources, reviewing prior hydrocarbon management decisions, and any other hydrocarbon-related acts or activities.

In all practical applications, the present technological advancement must be used in conjunction with a computer, programmed in accordance with the disclosures herein. Preferably, in order to efficiently perform FWI, the computer is a high performance computer (HPC), known as to those skilled in the art, Such high performance computers typically involve clusters of nodes, each node having multiple CPU's and computer memory that allow parallel computation. The models may be visualized and edited using any interactive visualization programs and associated hardware, such as monitors and projectors. The architecture of system may vary and may be composed of any number of suitable hardware structures capable of executing logical operations and displaying the output according to the present technological advancement. Those of ordinary skill in the art are aware of suitable supercomputers available from Cray or IBM.

The foregoing application is directed to particular embodiments of the present technological advancement for the purpose of illustrating it. It will be apparent, however, to one skilled in the art, that many modifications and variations to the embodiments described herein are possible. All such modifications and variations are intended to be within the scope of the present invention, as defined in the appended claims. Persons skilled in the art will readily recognize that in preferred embodiments of the invention, some or all of the steps in the present inventive method are performed using a computer, i.e. the invention is computer implemented. In such cases, the resulting gradient or updated physical properties model may be downloaded or saved to computer storage.

We claim:

1. A method of full wavefield inversion using simultaneous-source, ocean bottom sensor (OBS) data, comprising:
    obtaining, with a computer, simultaneous-source OBS data recorded by receivers in a seismic acquisition survey, wherein obtaining simultaneous-source OBS data comprises recording overlapping data at a receiver location from more than one source excitation location and wherein the seismic acquisition survey comprises a number of source excitation locations that is greater than a number of receiver locations;
    sorting the simultaneous-source OBS data to obtain common-receiver gathers without regard to reciprocity, and without deblending the simultaneous-source OBS data;
    generating, with a computer, synthetic OBS seismic data from an initial earth model based on reciprocity, wherein reciprocity comprises utilizing receiver locations from the seismic acquisition survey as source excitation locations when generating the synthetic OBS seismic data and utilizing source excitation locations from the seismic acquisition survey as receiver locations when generating the synthetic OBS seismic data;
    blending, with a computer, said synthetic OBS seismic data to form a blended synthetic data;
    differencing, with a computer, said common-receiver gathers and said blended synthetic data to form a pseudo-deblended residual;
    computing a model gradient using the pseudo-deblended residual;
    updating the initial earth model based on the model gradient to form an updated model; and
    prospecting for hydrocarbons at a location derived from the updated model.

2. The method of claim 1, wherein the blending of said synthetic OBS seismic data is based on field acquisition parameters.

3. The method of claim 1, wherein the model is an earth model.

4. The method of claim 1, further comprising imaging subsurface structures from the updated model.

5. A method of full wavefield inversion using simultaneous-source, ocean bottom sensor (OBS) data, comprising:
    obtaining, with a computer, simultaneous-source OBS data recorded by receivers in a seismic acquisition, wherein obtaining simultaneous-source OBS data comprises recording overlapping data at a receiver location from more than one source excitation location and wherein the seismic acquisition comprises a number of source excitation locations that is greater than a number of receiver locations;
    sorting the simultaneous-source OBS data to obtain common-receiver gathers without regard to reciprocity, and without deblending the simultaneous-source OBS data;
    obtaining, with a computer at least one of conventional streamer seismic data, conventional OBS seismic data, and simultaneous-source streamer seismic data;
    generating, with a computer, synthetic OBS seismic data from an initial earth model based on reciprocity, wherein reciprocity comprises utilizing receiver locations from the seismic acquisition survey as source excitation locations when generating the synthetic OBS seismic data and utilizing source excitation locations from the seismic acquisition survey as receiver locations when generating the synthetic OBS seismic data;
    blending, with a computer, said synthetic OBS seismic data corresponding to said obtained simultaneous source OBS seismic data;
    differencing, with a computer, said common-receiver gathers and said synthetic OBS to form a pseudo deblended residual;
    differencing, with a computer, said conventional OBS seismic data or streamer seismic data and corresponding synthetic seismic data to obtain a conventional OBS residual or a streamer residual;
    using one or more of the pseudo-deblended residual, the conventional OBS residual, or the streamer residual to compute a model gradient;
    updating, with a computer, the initial earth model based on the model gradient to form an updated model; and
    prospecting for hydrocarbons at a location derived from the updated model.

6. The method of claim 5, wherein the blending of said synthetic OBS seismic data is based on field acquisition parameters.

7. The method of claim 5, wherein the blending of said synthetic OBS seismic data is based on field acquisition parameters.

8. The method of claim 5, wherein the model is an earth model.

* * * * *